United States Patent
Atesoglu (10) Patent No.: US 7,602,260 B1
(45) Date of Patent: Oct. 13, 2009

(54) PROGRAMMABLE SUPPLY VOLTAGE REGULATOR FOR OSCILLATOR

(75) Inventor: Ali Atesoglu, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 36 days.

(21) Appl. No.: 11/944,386

(22) Filed: Nov. 21, 2007

(51) Int. Cl.
*H03L 1/00* (2006.01)
(52) U.S. Cl. .................................................. 331/186
(58) Field of Classification Search .......... 331/185–186
See application file for complete search history.

(56) References Cited

U.S. PATENT DOCUMENTS

| | | | |
|---|---|---|---|
| 4,593,256 A * | 6/1986 | Bickley | 331/117 R |
| 7,042,277 B2 * | 5/2006 | Cranford et al. | 327/538 |
| 7,064,622 B2 | 6/2006 | Jasa et al. | |
| 7,078,980 B2 | 7/2006 | Muramatsu | |

OTHER PUBLICATIONS

U.S. Appl. No. 11/754,295, filed May 27, 2007, Shumarayev et al.
U.S. Appl. No. 11/558,800, filed Nov. 10, 2006, Lai et al.

* cited by examiner

*Primary Examiner*—David Mis
(74) *Attorney, Agent, or Firm*—Steven J. Cahill (57) ABSTRACT

A circuit comprises a programmable voltage regulator and an oscillator. The programmable regulator generates a regulated supply voltage using an input voltage and changes the regulated supply voltage from a first voltage to a second voltage in response to a first control signal. The first and the second voltages are generated using charge from the input voltage. The regulated supply voltage drives the oscillator. The oscillator varies a frequency of a periodic output signal within a frequency range in response to changes in a control voltage. The frequency range of the periodic output signal varies when the first control signal causes the regulated supply voltage to change from the first voltage to the second voltage.

21 Claims, 8 Drawing Sheets

U.S. Pat. No. 7,602,260 B1

PROGRAMMABLE SUPPLY VOLTAGE REGULATOR FOR OSCILLATOR

BACKGROUND OF THE INVENTION

The present invention relates to electronic circuits, and more particularly, to programmable supply voltage regulators for oscillator circuits.

A phase-locked loop (PLL) is an electronic circuit that generates one or more periodic (clock) output signals. A PLL adjusts the frequency of a feedback signal from the output of an oscillator to match in phase the frequency of an input reference clock signal. Phase-locked loops (PLLs) are an essential building block of many integrated circuits, providing periodic signals for data recovery, data transfer, and other clocking functions.

BRIEF SUMMARY OF THE INVENTION

According to some embodiments of the present invention, a circuit comprises a programmable regulator and an oscillator. The programmable regulator generates a regulated supply voltage using an input voltage and changes the regulated supply voltage from a first voltage to a second voltage in response to a first control signal. The first and the second voltages are generated using charge from the input voltage. The regulated supply voltage drives the oscillator. The oscillator varies a frequency of a periodic output signal within a frequency range in response to changes in a control voltage. The frequency range of the periodic output signal varies when the first control signal causes the regulated supply voltage to change from the first voltage to the second voltage.

Various objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
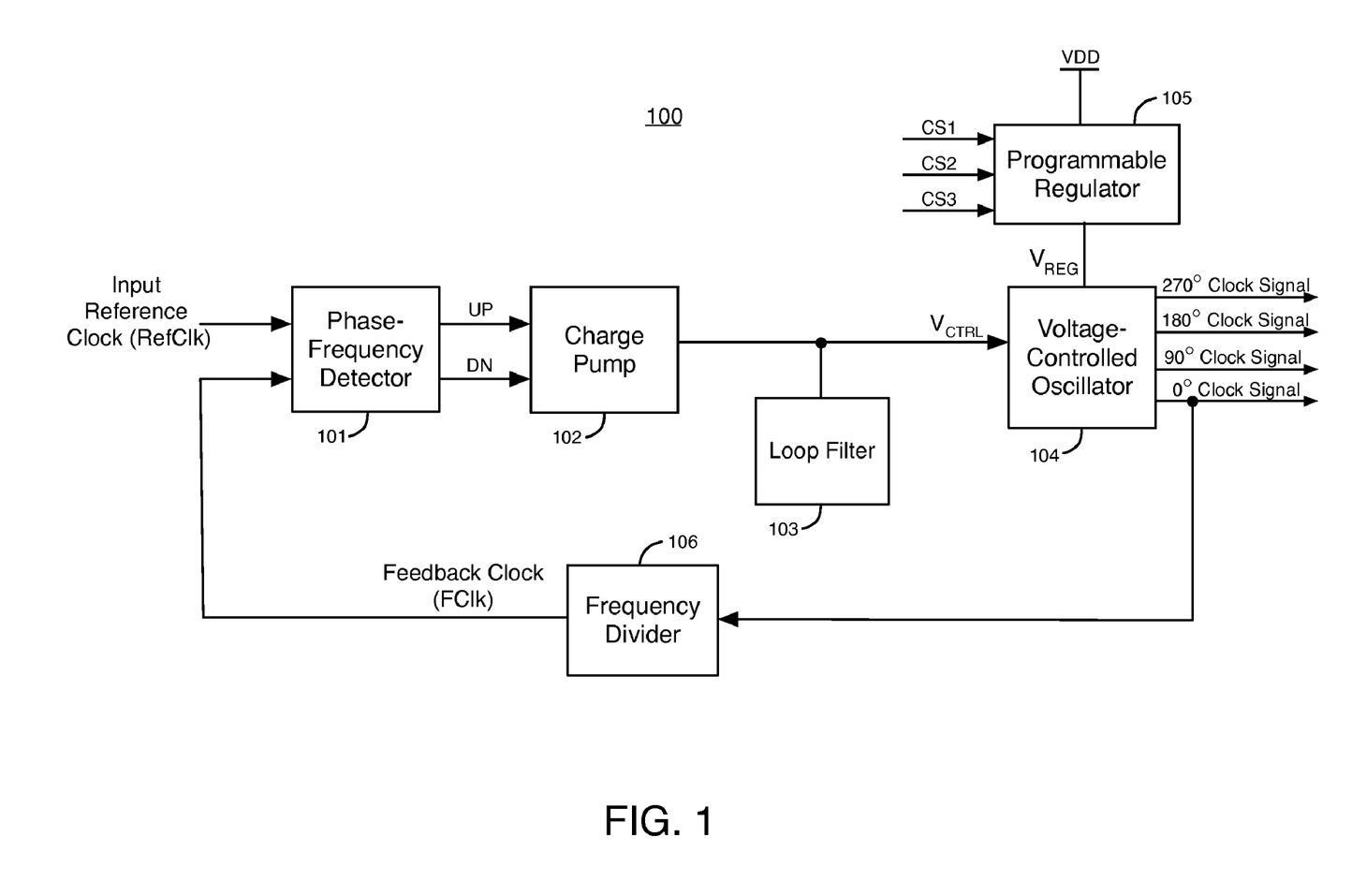
FIG. 1 illustrates a block diagram of a phase-locked loop (PLL), according to an embodiment of the present invention.

FIG. 1 illustrates a phase-locked loop (PLL) 100, according to an embodiment of the present invention. PLL 100 is merely one example of a phase-locked loop that can include embodiments of the present invention. It should be understood that embodiments of the present invention can be used in PLLs having numerous other configurations. PLL 100 is typically fabricated on an integrated circuit, such as an application specific integrated circuit, a field programmable gate array, or a programmable logic device.

PLL 100 is a feedback loop circuit that includes a phase-frequency detector circuit 101, a charge pump circuit 102, a loop filter circuit 103, a voltage-controlled oscillator circuit 104, programmable regulator circuit 105, and a frequency divider circuit 106. Phase-frequency detector (PFD) 101 compares the phase and the frequency of an input reference clock signal (RefClk) to the phase and the frequency of a feedback clock signal (FClk) generated by frequency divider 106.

Phase-frequency detector 101 generates UP and DN (down) error signals that are indicative of the differences between the phases and the frequencies of the input reference clock signal RefClk and the feedback clock signal FClk. The UP and DN error signals are transmitted to charge pump 102. Charge pump 102 converts the UP and DN error signals into a control voltage $V_{CTRL}$ that is transmitted to voltage-controlled oscillator (VCO) 104. Loop filter 103 is a low pass filter that attenuates high frequency components of control voltage $V_{CTRL}$.

Voltage-controlled oscillator (VCO) 104 generates four periodic output clock signals. The phases of the four output clock signals are offset by 90 degrees relative to the two adjacent phases. The phase of the first output clock signal is 0°, the phase of the second output clock signal is 90°, the phase of the third output clock signal is 180°, and the phase of the fourth output clock signal is 270°. VCO 104 varies the frequency of its four output clock signals within a frequency range in response to changes in the control voltage $V_{CTRL}$. The frequency range of VCO 104 refers to the range of frequencies that VCO 104 generates for its output clock signals in response to control voltage $V_{CTRL}$ varying across its full voltage range. The frequency range of the four VCO output clock signals is set based on a regulated supply voltage $V_{REG}$ generated by programmable regulator 105. According to alternative embodiments, PLL 100 can have a current-controlled oscillator or another type of oscillator, instead of VCO 104.

Frequency divider 106 divides the frequency of the 0° output clock signal to generate feedback clock signal FClk. Frequency divider 106 can, for example, be a divide-by-N counter circuit. Frequency divider 106 allows VCO 104 to generate output clock signals having frequencies greater than the frequency of the input reference clock signal RefClk. PLL 100 adjusts the control voltage $V_{CTRL}$ until both the phase and the frequency of feedback clock signal FClk match the phase and the frequency of reference clock signal RefClk.

Programmable regulator 105 receives an input supply voltage VDD and provides a constant regulated supply voltage $V_{REG}$ to VCO 104, even when the input supply voltage is noisy. Programmable regulator 105 selects the voltage of $V_{REG}$ in response to the logic states of three digital control signals CS1, CS2, and CS3. Control signals CS1-CS3 can, for example, be generated in response to configuration data stored in memory in a field programmable gate array (FPGA).

Figure 2:
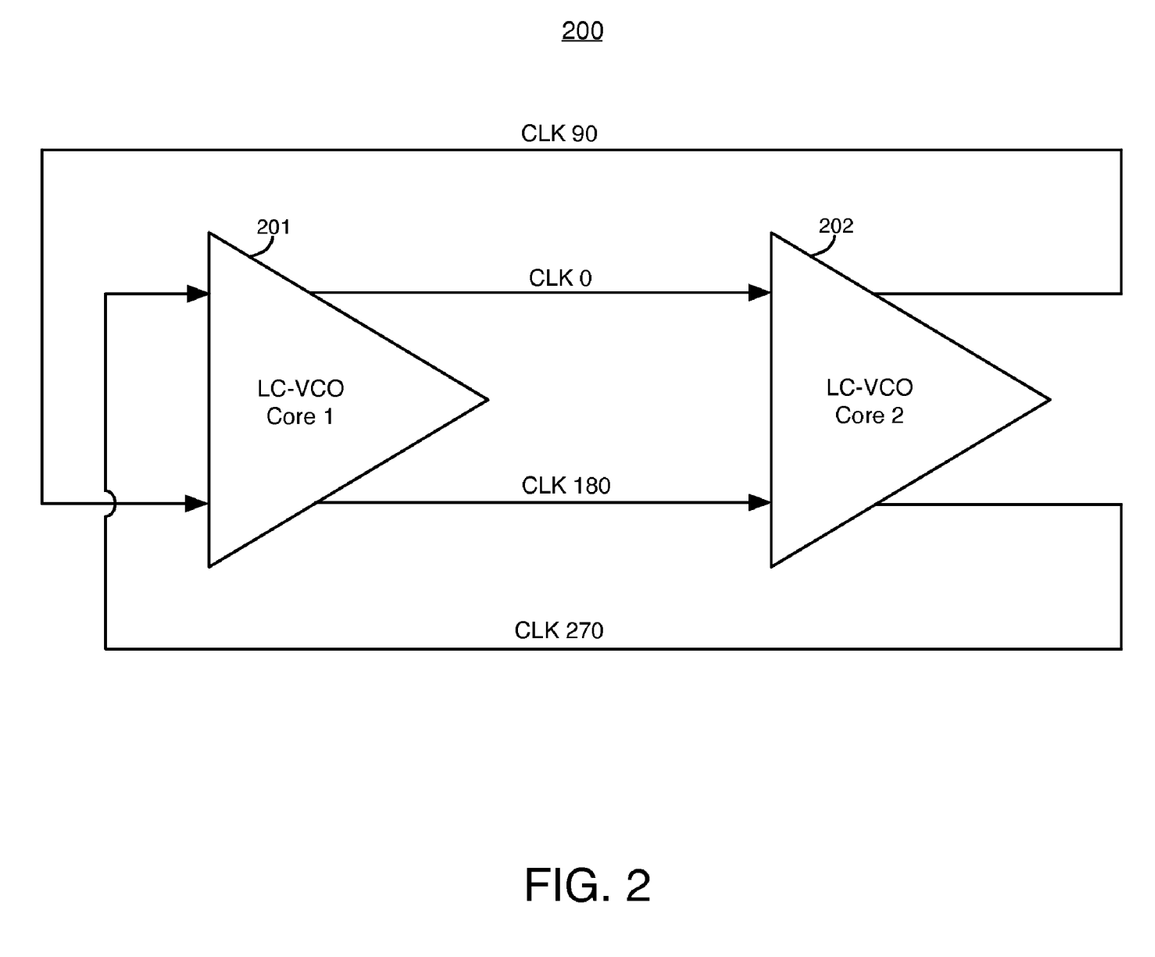
FIG. 2 illustrates a block diagram of an inductor-capacitor (LC) quadrature voltage-controlled oscillator (QVCO), according to an embodiment of the present invention.

FIG. 2 illustrates an example of an inductor-capacitor (LC) quadrature voltage-controlled oscillator (QVCO), according to an embodiment of the present invention. QVCO 200 shown in FIG. 2 is an example of VCO 104 shown in FIG. 1.

QVCO 200 includes two core LC-VCO circuits 201 and 202. QVCO 200 generates four digital clock (periodic) signals that are within a desired frequency range, e.g., 10 gigabits per second (Gbps). Differential LC-VCO circuits 201 and 202 are identical and are connected to each other. The inputs and the outputs of oscillator 201 are cross-coupled to the outputs and inputs oscillator 202, respectively, as shown in FIG. 2. As a result, the oscillator phase delays of LC-VCOs 201 and 202 are forced to synchronize with each other.

The difference in phase delay of the output clock signals of oscillators 201 and 202 is 90 degrees relative to each other. Thus, VCO 201 generates a first output clock signal having a relative phase of 0° and a second output clock signal having a relative phase of 180°. VCO 202 generates a third output clock signal having a relative phase of 90° and a fourth output clock signal having a relative phase of 270°.

Figure 3:
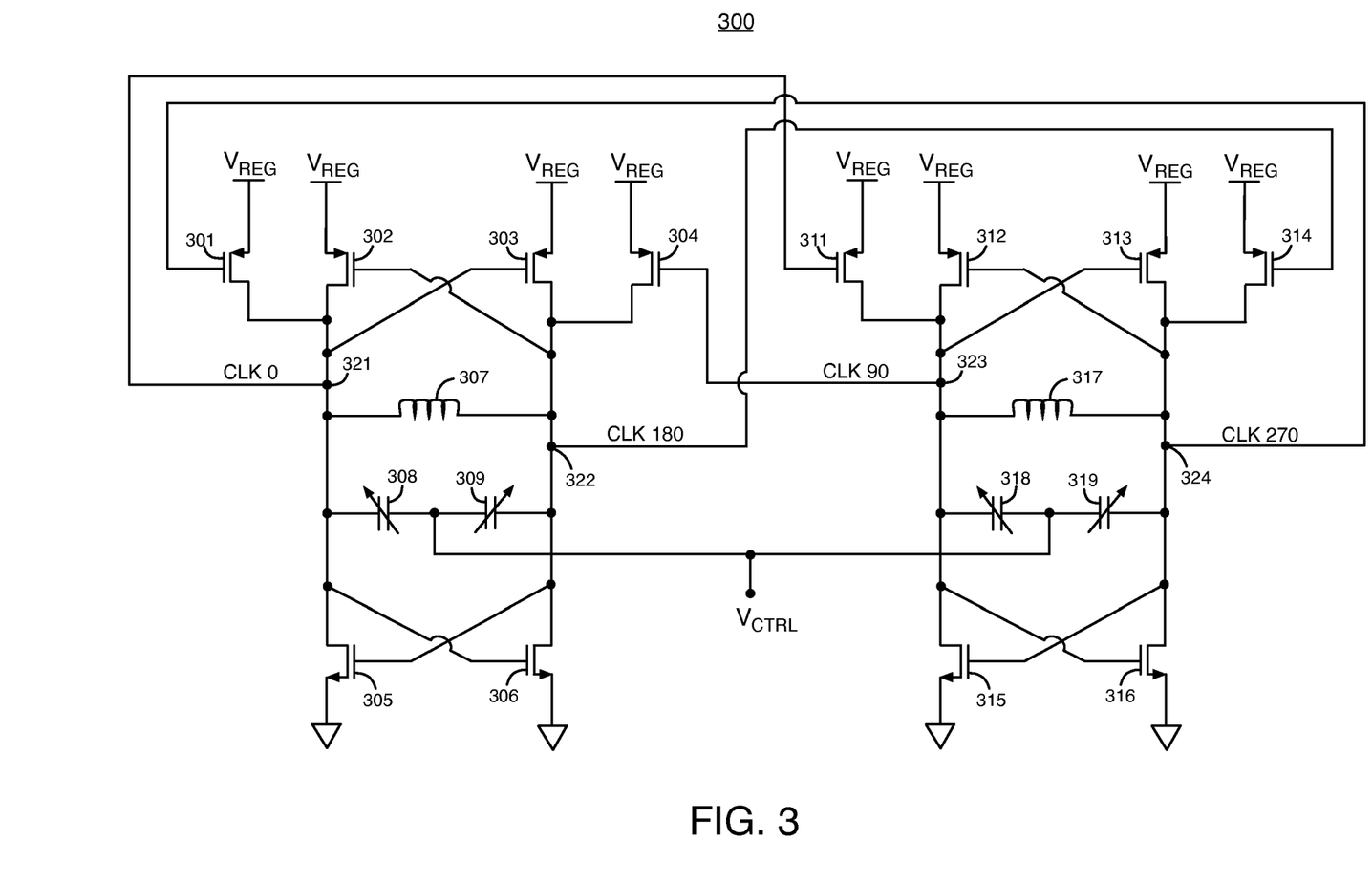
FIG. 3 is a schematic diagram of a LC-QVCO, according to an embodiment of the present invention.

FIG. 3 is a schematic diagram of a LC-QVCO 300, according to an embodiment of the present invention. LC-QVCO 300 (also referred to herein as QVCO 300 or VCO 300) is an example of an architecture that can be used to implement LC-QVCO 200 in FIG. 2 and VCO 104 in FIG. 1. QVCO 300 includes p-channel metal oxide semiconductor field-effect transistors (MOSFETs) 301-304 and 311-314, n-channel MOSFETs 305-306 and 315-316, inductors 307 and 317, and varactors 308-309 and 318-319. The transistors in QVCO 300 can be, for example, thin oxide transistors that have oxide widths of about 17 angstroms.

Varactors 308-309 and 318-319 are capacitors that have a variable capacitance. Varactors 308-309 and 318-319 can be, for example, reverse-biased diodes. The capacitance of each varactor 308-309 and 318-319 varies in response to changes in the voltage across the varactor. Charge pump 102 generates a control voltage $V_{CTRL}$ that is transmitted to a terminal of each of the varactors 308, 309, 318, and 319 as shown in FIG. 3. The capacitance of the varactors varies in response to changes in $V_{CTRL}$. The inductances of the inductors 307 and 317 in FIG. 3 are constant.

QVCO 300 includes VCOs 201 and 202. Circuits 301-309 form the first LC-VCO 201, and circuits 311-319 form the second LC-VCO 202. The gate of p-channel MOSFET 304 is coupled to the first output node 323 of VCO 202 at inductor 317 and varactor 318. The gate of p-channel MOSFET 301 is coupled to the second output node 324 of VCO 202 at inductor 317 and varactor 319. VCO 202 generates a digital clock signal CLK 90 having a 90° phase at the first output node 323 and a digital clock signal CLK 270 having a 270° phase at the second output node 324.

The gate of p-channel MOSFET 311 is coupled to the first output node 321 of VCO 201 at inductor 307 and varactor 308. The gate of p-channel MOSFET 314 is coupled to the second output node 322 of VCO 201 at inductor 307 and varactor 309. VCO 201 generates a digital clock signal CLK 0 having a 0° phase at the first output node 321 and a digital clock signal CLK 180 having a 180° phase at the second output node 322. Transistors 301-306 and 311-316 turn on and off to generate these four digital output clock signals.

P-channel MOSFETs 302 and 303 are cross-coupled. P-channel MOSFETs 312 and 313 are cross-coupled. N-channel MOSFETs 305 and 306 are cross-coupled. N-channel MOSFETs 315 and 316 are cross-coupled. The crossed coupled p-channel and n-channel MOSFETs create an active element that compensates for the resistive losses of the inductors 307 and 317 and the varactors 308-309 and 318-319.

The sources of transistors 301-304 and 311-314 are coupled to receive a regulated supply voltage $V_{REG}$ from programmable regulator 105. The sources of transistors 305-306 and 315-316 are coupled to a common ground voltage. An example of a width-to-length (W/L) channel ratio for each of transistors 304 and 305 is 20/0.18 micrometers (μm). An example W/L channel ratio for transistor 302 is 40/0.18 μm.

The inductors and the varactors in QVCO 300 form a parallel resonance LC tank. The LC tank locates its oscillating frequency $F_{OSC}$ as the capacitance of each of the varactors 308-309 and 318-319 is tuned by the control voltage $V_{CTRL}$. The frequency range of the four output clock signals of QVCO 300 is shown in equations (1) and (2).

$$F_{OSC,MIN} < F_{OSC} < F_{OSC,MAX} \quad (1)$$

$$\frac{1}{\sqrt{LC_{VAR,MAX}}} < 2\pi \times F_{OSC} < \frac{1}{\sqrt{LC_{VAR,MIN}}} \quad (2)$$

In equation (1), $F_{OSC,MIN}$ refers to the minimum operating frequency of the output clock signals of QVCO 300, and $F_{OSC,MAX}$ refers to the maximum operating frequency of the output clock signals of QVCO 300. In equation (2), L is the inductance of inductors 307 and 317, $C_{VAR,MAX}$ is the maximum capacitance of varactors 308-309 and 318-319, and $C_{VAR,MIN}$ is the minimum capacitance of varactors 308-309 and 318-319.

Optimization of the frequency range of the output clock signals of QVCO 300 in a PLL is crucial for some applications. It is also important to optimize the tuning range phase noise performance of the output clock signals of QVCO 300. A few parameters can be adjusted to achieve a wide frequency range. These parameters include the quality (Q) factor of the inductors 307 and 317 and varactors 308-309 and 318-319, the simulated design sizes of the inductors 307 and 317 and the varactors 308-309 and 318-319, and the maximum tunable range of the varactors 308-309 and 318-319.

In addition, the control voltage range of $V_{CTRL}$ from charge pump 102 should be maximized in order to be able to achieve the maximum frequency range performance from varactors 308-309 and 318-319. Thus, charge pump 102 should be able to generate the minimum and maximum values of the control voltage $V_{CTRL}$.

The simulated design sizes of MOSFETs 301-306 and 311-316 increase the inductive and capacitive (LC) tank parasitics. The amount of average current passing through the transistors in QVCO 300 applies to the metal thickness of the connections, which may increase the LC tank parasitic as well.

Imperfect modeling of the inductance values of inductors 307 and 317, any unexpected LC parasitics in QVCO 300, and process, supply voltage, and temperature (PVT) variations of the integrated circuit can cause the center frequency and the frequency range of the output clock signals of QVCO 300 to shift. The center frequency is the midpoint of the frequency range. Inductive and capacitive (LC) parasitics in QVCO 300 have a particularly significant impact on the frequency range at large output clock signal frequencies.

These factors may cause the frequency range of the output clock signals of QVCO 300 to shift outside the design specification frequency range. If the frequency range of QVCO 300 shifts outside the design specification frequency range, the output clock signals of QVCO 300 do not vary across the full frequency range that QVCO 300 is intended to achieve. A shift in the center frequency and the frequency range of VCO 104/300 is particularly problematic in programmable PLLs that are fabricated in programmable logic integrated circuits, such as FPGAs, because programmable PLLs are supposed to generate output clock signals that have a wide frequency range to meet a variety of user specifications.

According to some embodiments of the present invention, a programmable regulator is used to re-center the center frequency of the output clock signals of QVCO 300, while maintaining the output frequency range within a design specification. These benefits can be achieved without adding a second tuning knob to QVCO 300. A second tuning knob can cause phase noise degradation. Programmable regulator 105 allows QVCO 300 to generate high frequency output clock signals, e.g., 6 GHz or more.

Figure 4:
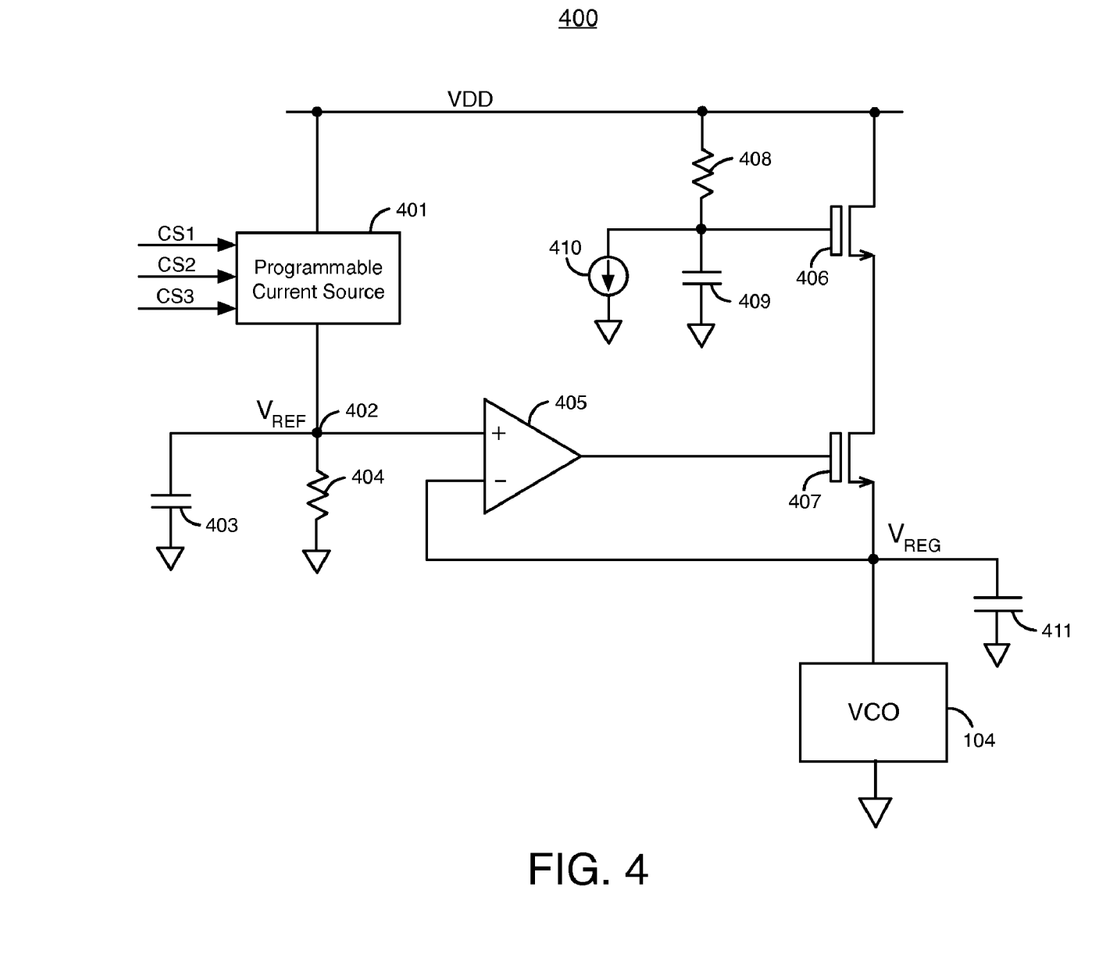
FIG. 4 illustrates an example of a programmable voltage regulator that can be used to generate a regulated supply voltage for an oscillator circuit, according to an embodiment of the present invention.

FIG. 4 illustrates an example of a programmable voltage regulator that generates a supply voltage for an oscillator circuit, according to an embodiment of the present invention. Programmable voltage regulator 400 in FIG. 4 is an example of programmable regulator 105 shown in FIG. 1. Programmable voltage regulator 400 can be located on the same integrated circuit as the other components of PLL 100.

Programmable voltage regulator 400 includes a programmable current source 401, resistors 404 and 408, capacitors 403, 409 and 411, operational amplifier 405, n-channel MOSFETs 406-407, and constant current source 410. MOSFETs 406 and 407 are coupled in series between input supply voltage VDD (e.g., 3 volts) and voltage-controlled oscillator (VCO) 104. Transistors 406 and 407 are thick oxide transistors (e.g., having gate thicknesses of 55 angstroms each). Transistors 406 and 407 can be, for example, native devices with low threshold voltages (e.g., about 0 volts).

The sources of transistors 301-304 and 311-314 in VCO 104/300 are coupled to receive a regulated supply voltage $V_{REG}$ from the source of transistor 407. Current flows from input voltage VDD through transistors 406-407 to transistors 301-304 and 311-314.

Transistor 406, resistor 408, capacitor 409, and current source 410 are an active RC low pass filter. Resistor 408 is coupled between VDD and the gate of transistor 406. Capacitor 409 is coupled between the gate of transistor 406 and ground. Current source 410 is coupled between the gate of transistor 406 and ground.

Input supply voltage VDD is coupled to provide current to numerous other circuit elements that are fabricated on the same integrated circuit as PLL 100. The other circuit elements draw a variable amount of current that causes noise (e.g., 50 millivolts) in input supply voltage VDD. Current source 410 generates a constant current that flows from VDD through resistor 408 to ground. Constant current source 410 maintains the voltage drop across resistor 408 constant. The voltage on capacitor 409 at the gate of transistor 406 fluctuates in response to the noise in input supply voltage VDD. The source voltage (e.g., 2 volts) of transistor 406 is low enough so that transistor 406 remains in saturation despite fluctuations in input supply voltage VDD. As a result, the current through transistor 406 stays constant or fluctuates by only a small percentage in response to noise in VDD.

Operational amplifier 405, programmable current source 401, capacitor 403, resistor 404, and n-channel transistor 407 are an active voltage regulator circuit. The active voltage regulator circuit generates a constant, low noise supply voltage $V_{REG}$ on capacitor 411 at the source of transistor 407 for providing current to VCO 104. For example, the noise on $V_{REG}$ may be 3 millivolts. Programmable regulator 400 has a very large power supply rejection ratio (PSRR) (e.g., less than −50 dBV) over a wide frequency range of the noise in VDD.

The non-inverting (+) input of amplifier 405 is coupled to current source 401, capacitor 403, and resistor 404 at node 402. Resistor 404 and capacitor 403 are coupled in parallel and to a common ground voltage. The inverting (−) input of amplifier 405 is coupled to the source of transistor 407, capacitor 411, and VCO 104. The output of amplifier 405 is coupled to the gate of transistor 407.

Programmable current source 401 generates an output current that flows through resistor 404 to ground to generate a reference voltage $V_{REF}$ at the non-inverting input of amplifier 405. Reference voltage $V_{REF}$ equals the voltage drop across resistor 404. Amplifier 405 is a unity gain amplifier that adjusts its output voltage to minimize or eliminate the voltage differential between its two input terminals. Amplifier 405 sets the current through transistor 407 to cause supply voltage $V_{REG}$ to be approximately equal to reference voltage $V_{REF}$. The voltage difference between $V_{REG}$ and $V_{REF}$ is typically small (e.g., 10 millivolts). The active voltage regulator circuit in programmable regulator 400 generates a regulated and constant supply voltage $V_{REG}$ on capacitor 411. $V_{REG}$ drives voltage-controlled oscillator (VCO) 104.

Voltages $V_{REF}$ and $V_{REG}$ are set based on the output current generated by programmable current source 401. Programmable current source 401 generates an output current in response to three digital control signals CS1, CS2, and CS3. Programmable current source 401 adjusts its output current in response to a change in the logic state of one or more of control signals CS1-CS3, which causes voltage $V_{REF}$ to change. When $V_{REF}$ changes, amplifier 405 and transistor 407 adjust $V_{REG}$ to match the new voltage of $V_{REF}$.

Programmable voltage regulator 400 controls the supply voltage $V_{REG}$ provided to VCO 104. The logic states of control signals CS1-CS3 can be changed to cause regulator 400 to increase or decrease voltage $V_{REG}$. The 3 control signals CS1-CS3 can generate 8 different 3-bit control states. According to specific examples, the output voltage $V_{REG}$ of programmable regulator 400 can be set to one of 5, 6, 7, or 8 different discrete (non-continuous) voltages between 1.0 volt and 1.5 volts in response to changes in the logic states of input control signals CS1-CS3. The discrete voltages of $V_{REG}$ can be, for example, 1.0, 1.1, 1.2, 1.3, 1.4, and 1.5 volts. These examples are not intended to limit the scope of the present invention.

As mentioned above, the center frequency and the frequency range of the output clock signals of QVCO 300 can shift from ideal values in response to imperfect modeling of the inductances of inductors 307 and 317, unexpected parasitic inductances and capacitances in QVCO 300, and variations in the process, the supply voltage, and the temperature (PVT) of the integrated circuit. Programmable regulator 105/400 can adjust the center frequency and the frequency range of the output clock signals of QVCO 104/300 by changing the regulated supply voltage $V_{REG}$. Programmable regulator 105/400 can, for example, add an extra 8-10% of frequency range for re-centering the center frequency of QVCO 104/300.

Figure 5:
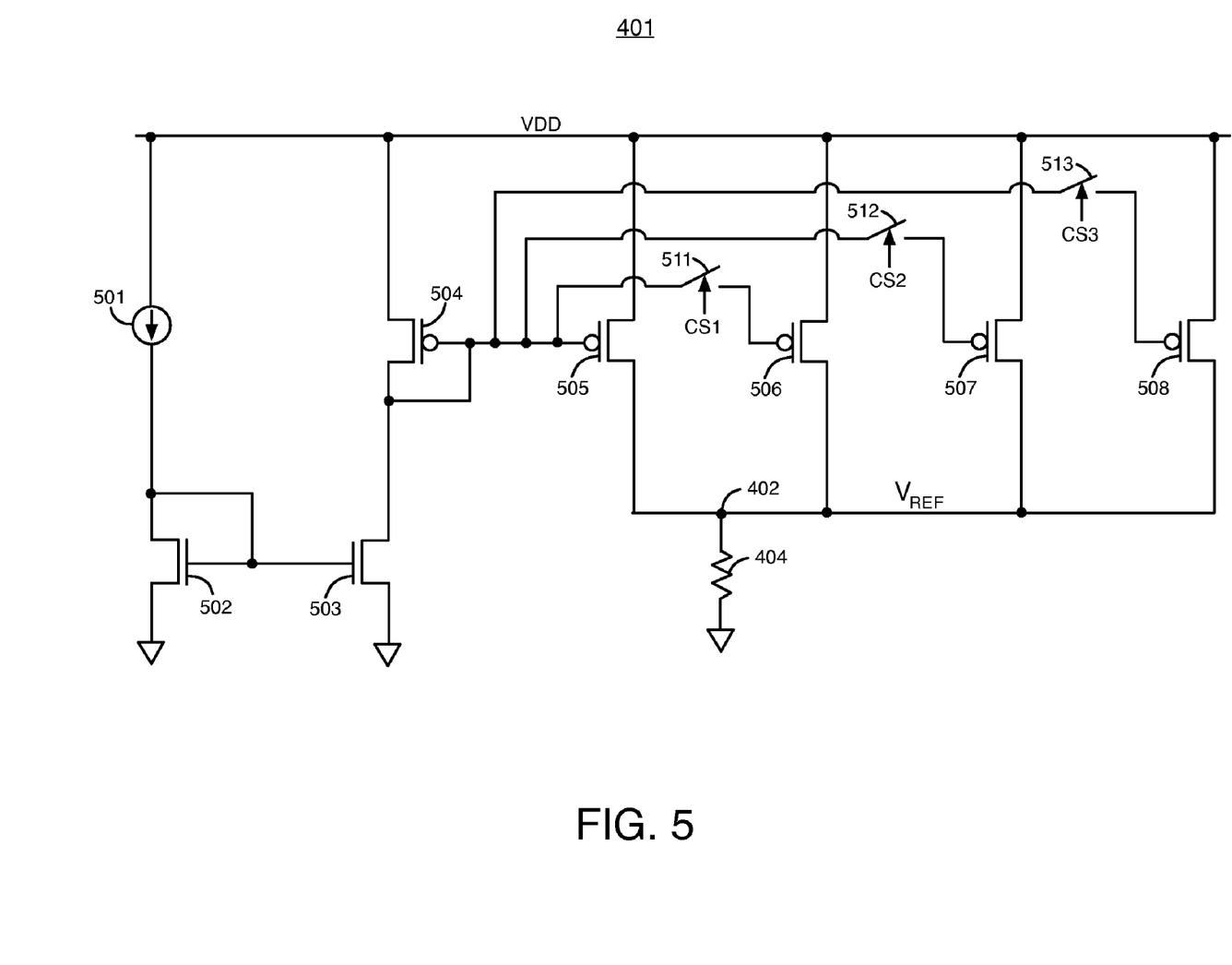
FIG. 5 illustrates a specific example of a programmable current source in a programmable regulator, according to an embodiment of the present invention.

FIG. 5 illustrates a specific example of programmable current source 401 in programmable voltage regulator 400, according to an embodiment of the present invention. Programmable current source 401 includes constant current source 501, n-channel MOSFETs 502-503, p-channel MOSFETs 504-508, and switches 511-513.

The drain of transistor 502 is coupled to current source 501, the gate of transistor 502, and the gate of transistor 503. The sources of transistors 502 and 503 are coupled to a common ground. N-channel MOSFETs 502-503 are coupled to form a current mirror circuit. Current source 501 generates a constant current that is the reference current for the current mirror circuit. The reference current generated by current source 501 is mirrored to transistor 503, according to the relative width-to-length (W/L) channel ratios of transistors 502 and 503.

The drain of transistor 504 is coupled to the drain of transistor 503, the gate of transistor 504, and the gate of transistor 505. The drain current of transistor 504 equals the drain current of transistor 503. The sources of transistors 504-508 are coupled to input supply voltage VDD. The gate and drain of transistor 504 are coupled to the gate of transistor 506 when switch 511 is closed. The conductive state of switch 511 is controlled by the logic state of control signal CS1. The gate and drain of transistor 504 are coupled to the gate of transistor 507 when switch 512 is closed. The conductive state of switch 512 is controlled by the logic state of control signal CS2. The gate and drain of transistor 504 are coupled to the gate of transistor 508 when switch 513 is closed. The conductive state of switch 513 is controlled by the logic state of control signal CS3.

Switch 511 is closed and conducting current when control signal CS1 is a logic high, and switch 511 is open and blocking current flow when control signal CS1 is a logic low. Switch 512 is closed and conducting current when control signal CS2 is a logic high, and switch 512 is open and blocking current flow when control signal CS2 is a logic low. Switch 513 is closed and conducting current when control signal CS3 is a logic high, and switch 513 is open and blocking current flow when control signal CS3 is a logic low.

P-channel transistors 504-508 form a current mirror circuit when switches 511, 512, and 513 are closed. The drain current of transistor 504 is mirrored to transistor 505, according to the relative width-to-length (W/L) channel ratios of transistors 504 and 505. When switch 511 is closed, the drain current of transistor 504 is mirrored to transistor 506, according to the relative W/L channel ratios of transistors 504 and 506. When switch 512 is closed, the drain current of transistor 504 is mirrored to transistor 507, according to the relative W/L channel ratios of transistors 504 and 507. When switch 513 is closed, the drain current of transistor 504 is mirrored to transistor 508, according to the relative W/L channel ratios of transistors 504 and 508. The relative W/L channel ratios of transistors 504, 505, 506, 507, and 508 can be, for example, 1X, 2X, 3X, 4X, and 5X, respectively, where X is the W/L channel ratio of transistor 504. In this particular example, the current generated by each of transistors 505-508 is a multiple of the drain current of transistor 504.

The drains of each of transistors 505-508 are coupled together and to resistor 404 at node 402. The drain currents of transistors 505-508 are summed together at node 402 and through resistor 404. Control signals CS1-CS3 can close one or more of switches 511-513, respectively, to increase the current through resistor 404, which increases the voltage drop across resistor 404. Control signals CS1-CS3 can open or more of switches 511-513, respectively, to decrease the current through resistor 404, which decreases the voltage drop across resistor 404.

The voltage drop across resistor 404 equals $V_{REF}$. As discussed above, amplifier 405 regulates the current through transistor 407 to cause $V_{REG}$ to be approximately equal to $V_{REF}$. When the control signals CS1-CS3 cause $V_{REF}$ to change, $V_{REG}$ changes from a first discrete voltage to a second discrete voltage that is different from the first discrete voltage. For example, as the total current through transistors 505-508 increases in response to a change in the logic state(s) of one or more of control signals CS1-CS3, $V_{REF}$ and $V_{REG}$ increase to larger voltages. As the total current through transistors 505-508 decreases in response to a change in the logic state(s) of one or more of control signals CS1-CS3, $V_{REF}$ and $V_{REG}$ decrease to smaller voltages. The regulated supply voltage $V_{REG}$ generated by programmable regulator 400 is adjusted in discrete voltage increments by changing the logic state(s) of one or more of control signals CS1-CS3. Current from input voltage VDD is used to provide charge to each of the discrete voltages of $V_{REG}$ that are generated by regulator 400 in response to control signals CS1-CS3.

The center frequency and the frequency range of the periodic output clock signals of VCO 104 vary when the control signals CS1-CS3 cause the regulated supply voltage $V_{REG}$ generated by programmable regulator 105/400 to change from a first voltage to a second voltage that is different than the first voltage. The changes in voltage $V_{REG}$ cause the capacitances of the varactors in QVCO 300 to vary by amounts that shift the center frequency and/or the frequency range of the QVCO 300 output clock signals. Programmable regulator 105/400 can be programmed to vary $V_{REG}$ to cause the center frequency and/or the frequency range of the output clock signals of VCO 104/300 to shift in order to compensate for shifts in the center frequency and/or the frequency range of the output clock signals of VCO 104/300 that are caused by PVT variations, imperfect modeling of the inductors, parasitic inductances and capacitances in VCO 104/300, etc. Programmable regulator 105/400 allows the capacitances of the varactors VCO 104/300 to vary over a wider range.

Three control signals CS1-CS3, three switches 511-513, and four current source transistors 505-508 are shown in FIG. 5 as an example. According to other embodiments, programmable current source 401 can have two, three, five, or more current source transistors, and one, two, four, or more switches controlled by a corresponding number of control signals.

Figure 6A:
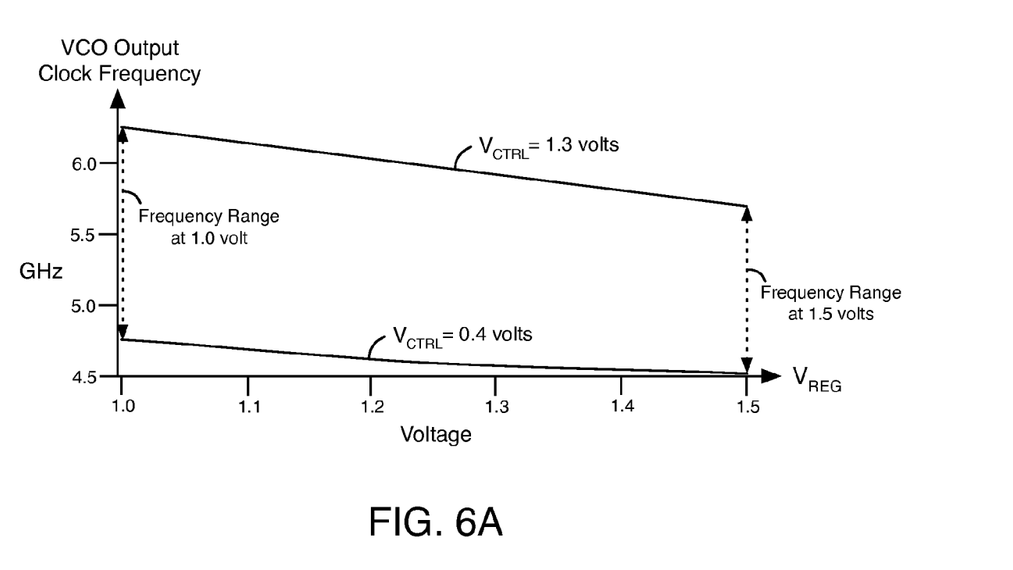
FIG. 6A is a graph plotting examples of variations in the frequency range of the output clock signals of an oscillator that occur as a result of changing the regulated supply voltage, according to an embodiment of the present invention.

FIG. 6A is a graph showing examples of variations in the frequency range of the output clock signals of VCO 104/300 that occur as a result of changing the regulated supply voltage $V_{REG}$ generated by programmable regulator 400, according to an embodiment of the present invention. In the particular example of FIG. 6A, the output voltage $V_{CTRL}$ of charge pump 102 varies from a minimum of 0.4 volts to a maximum of 1.3 volts. FIG. 6A illustrates two curves that plot variations in the frequency range of the output clock signals of VCO 104/300 over a range of voltages of $V_{REG}$ from 1.0-1.5 volts when $V_{CTRL}$ equals 1.3 volts and when $V_{CTRL}$ equals 0.4 volts.

Specific values are now listed from the example plots shown in FIG. 6A. The example values of FIG. 6A are provided for the purpose of illustration and are not intended to limit the scope of the present invention. The frequencies of the VCO output clock signals are 6.240 GHz (gigahertz) when $V_{REG}$ is 1.0 volts and $V_{CTRL}$ is 1.3 volts. The frequencies of the VCO output clock signals are 4.723 GHz when $V_{REG}$ is 1.0 volts and $V_{CTRL}$ is 0.4 volts. Thus, the frequency range of the output clock signals of VCO 300 varies between a maximum frequency of 6.240 GHz and a minimum frequency of 4.723 GHz when $V_{REG}$ equals 1.0 volts, as shown in FIG. 6A.

The frequencies of the VCO output clock signals are 5.712 GHz when $V_{REG}$ is 1.5 volts and $V_{CTRL}$ is 1.3 volts. The frequencies of the VCO output clock signals are 4.504 GHz when $V_{REG}$ is 1.5 volts and $V_{CTRL}$ is 0.4 volts. Thus, the frequency range of the output clock signals of VCO 300 varies between a maximum frequency of 5.712 GHz and a minimum frequency of 4.504 GHz when $V_{REG}$ equals 1.5 volts, as shown in FIG. 6A. The frequency range of the output clock signals of VCO 300 shifts up to larger frequencies or down to lower frequencies in response to changes in $V_{REG}$. The center frequency of the VCO output clock signals changes with the frequency range. Programmable regulator 400 can shift the frequency range of the output clock signals of VCO 300 to match a desired user specification.

Figure 6B:
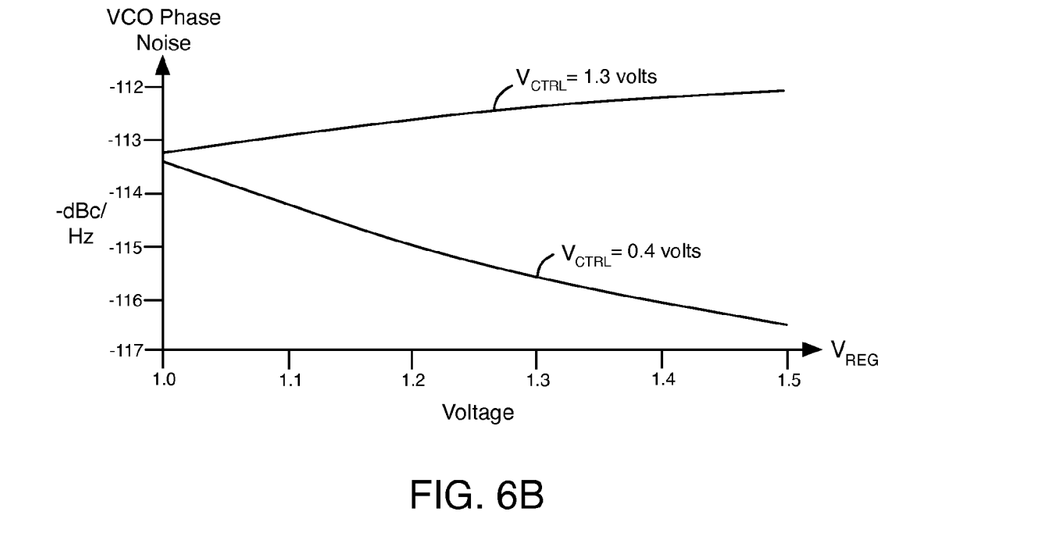
FIG. 6B is a graph plotting examples of variations in the phase noise of the output clock signals of an oscillator that occur as a result of changing the regulated supply voltage, according to an embodiment of the present invention.

FIG. 6B is a graph showing examples of variations in the phase noise of the output clock signals of VCO 104/300 that occur as a result of changing the regulated supply voltage $V_{REG}$ generated by programmable regulator 400, according to an embodiment of the present invention. The phase noise refers to the phase jitter of the output clock signals of VCO 300 in the frequency domain. In the example of FIG. 6B, the output voltage $V_{CTRL}$ of charge pump 102 varies from a minimum of 0.4 volts to a maximum of 1.3 volts. FIG. 6B illustrates two curves that plot variations in the phase noise of VCO 104/300 over a range of voltages of $V_{REG}$ from 1.0-1.5 volts when $V_{CTRL}$ equals 1.3 volts and when $V_{CTRL}$ equals 0.4 volts.

Specific values are now listed from the example plots shown in FIG. 6B. The example values of FIG. 6B are provided for the purpose of illustration and are not intended to limit the scope of the present invention. When $V_{CTRL}$ is 1.3 volts, the smallest value of the phase noise is −113.17 dBc/Hz at $V_{REG}$=1.0 volts, and the largest value of the phase noise is −112.05 dBc/Hz at $V_{REG}$=1.5 volts. When $V_{CTRL}$ is 0.4 volts, the largest value of the phase noise is −113.29 dBc/Hz at $V_{REG}$=1.0 volts, and the smallest value of the phase noise is −116.46 dBc/Hz at $V_{REG}$=1.5 volts. Thus, the phase noise of VCO 300 does not change significantly in response to variations in voltages $V_{REG}$ and $V_{CTRL}$. As a result, the output clock signals of VCO 300 remain very close to 90° apart from the two adjacent phases.

According to another embodiment, a clock and data recovery (CDR) circuit can include QVCO 300 and a programmable regulator 400 that adjusts the regulated supply voltage $V_{REG}$ provided to QVCO 300. According to yet another embodiment, programmable regulator 400 provides a variable supply voltage $V_{REG}$ to a current-starving voltage-controlled oscillator (VCO) having a ring of delay circuits that receive the regulated supply voltage $V_{REG}$.

According to an additional embodiment, programmable regulator 400 provides a programmable regulated supply voltage to a single tank LC-VCO. According to another embodiment, programmable regulator 400 provides a programmable regulated supply voltage to a ring voltage controlled oscillator (VCO). In general, programmable $V_{REG}$ frequency range widening techniques can be applied to all types of LC-VCO and ring-VCO designs. VCO 104 can be a single tank LC-VCO, a quadrature tank LC-VCO, a ring VCO, or another type of VCO.

Figure 7:
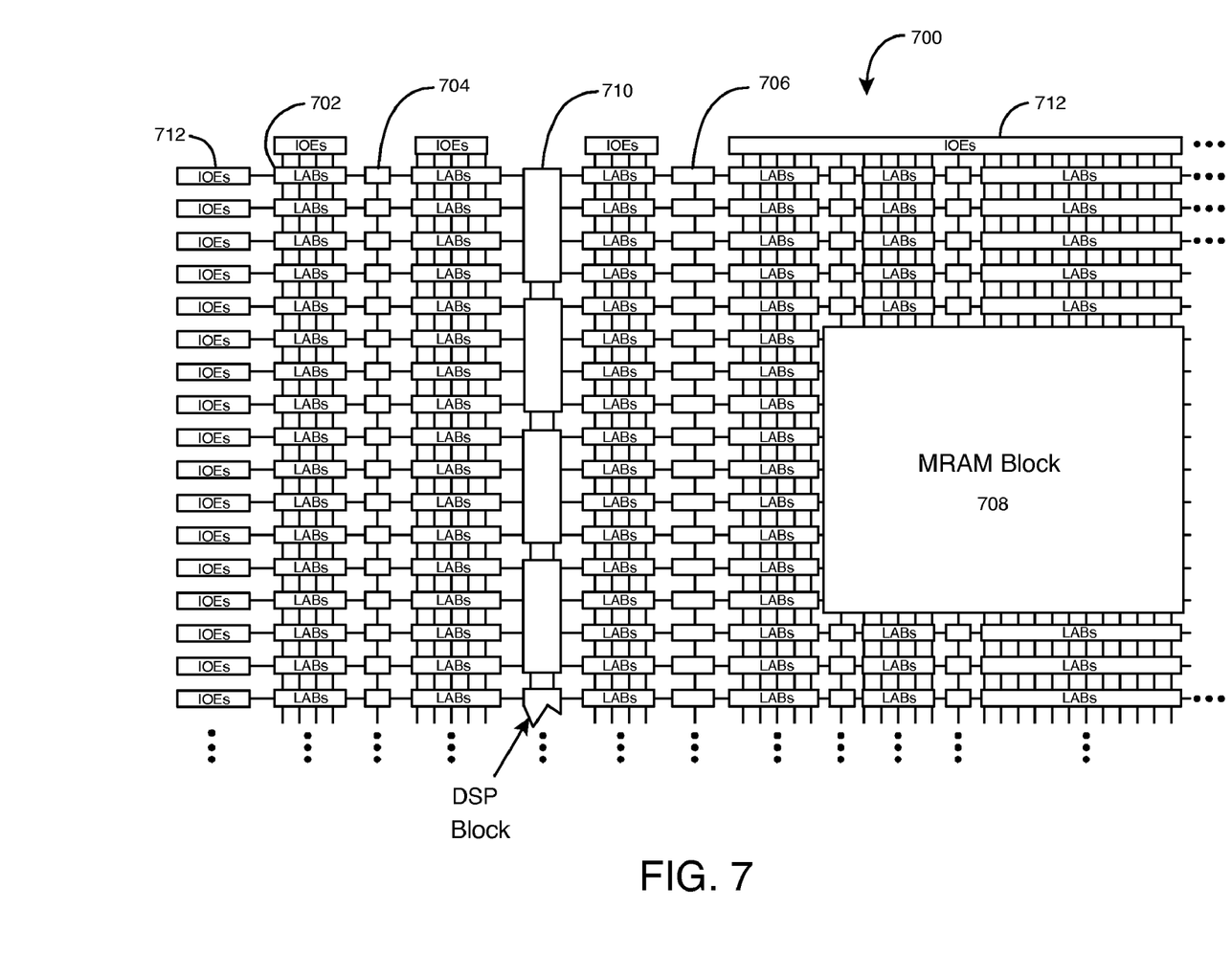
FIG. 7 is a simplified partial block diagram of a field programmable gate array (FPGA) that can include aspects of the present invention.

FIG. 7 is a simplified partial block diagram of a field programmable gate array (FPGA) 700 that can include aspects of the present invention. FPGA 700 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 700 includes a two-dimensional array of programmable logic array blocks (or LABs) 702 that are interconnected by a network of column and row interconnect conductors of varying length and speed. LABs 702 include multiple (e.g., 10) logic elements (or LEs).

A LE is a programmable logic block that provides for efficient implementation of user defined logic functions. A FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 700 also includes a distributed memory structure including random access memory (RAM) blocks of varying sizes provided throughout the array. The RAM blocks include, for example, blocks 704, blocks 706, and block 708. These memory blocks can also include shift registers and FIFO buffers.

FPGA 700 further includes digital signal processing (DSP) blocks 710 that can implement, for example, multipliers with add or subtract features. Input/output element (IOE) blocks 712 located, in this example, around the periphery of the chip support numerous single-ended and differential input/output standards. Each IOE 712 is coupled to an external terminal of FPGA 700. It is to be understood that FPGA 700 is described herein for illustrative purposes only and that the present invention can be implemented in many different types of PLDs, FPGAs, and ASICs.

Figure 8:
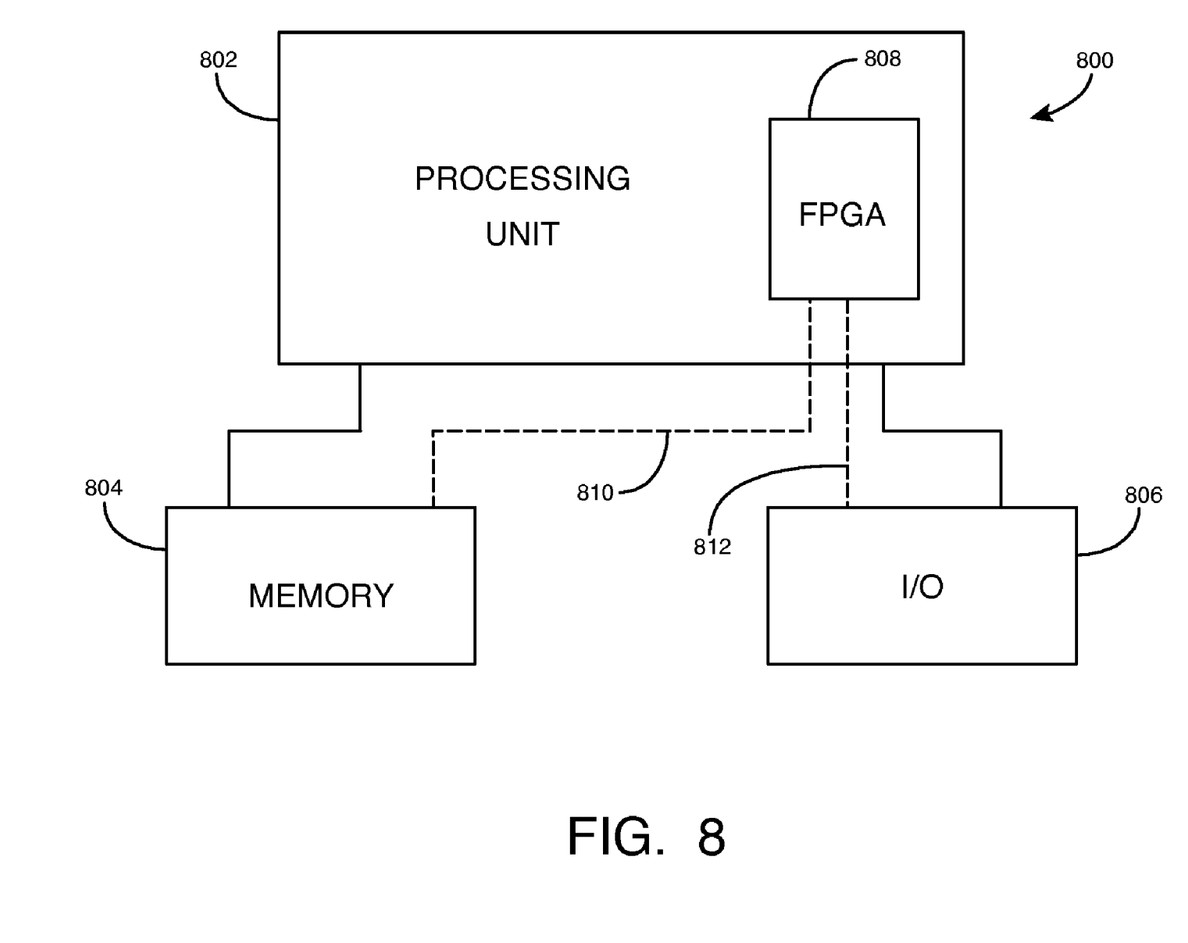
FIG. 8 shows a block diagram of an exemplary digital system that can embody techniques of the present invention.

The present invention can also be implemented in a system that has a FPGA as one of several components. FIG. 8 shows a block diagram of an exemplary digital system 800 that can embody techniques of the present invention. System 800 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 can be provided on a single board, on multiple boards, or within multiple enclosures.

System 800 includes a processing unit 802, a memory unit 804, and an input/output (I/O) unit 806 interconnected together by one or more buses. According to this exemplary embodiment, FPGA 808 is embedded in processing unit 802. FPGA 808 can serve many different purposes within the system in FIG. 8. FPGA 808 can, for example, be a logical building block of processing unit 802, supporting its internal and external operations. FPGA 808 is programmed to implement the logical functions necessary to carry on its particular role in system operation. FPGA 808 can be specially coupled to memory 804 through connection 810 and to I/O unit 806 through connection 812.

Processing unit 802 can direct data to an appropriate system component for processing or storage, execute a program stored in memory 804, receive and transmit data via I/O unit 806, or other similar function. Processing unit 802 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 808 can control the logical operations of the system. As another example, FPGA 808 acts as a reconfigurable processor that can be reprogrammed as needed to handle a particular computing task. Alternately, FPGA 808 can itself include an embedded microprocessor. Memory unit 804 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
a programmable regulator that generates a regulated supply voltage using an input voltage and that changes the regulated supply voltage from a first voltage to a second voltage in response to a first control signal that is generated based on user configuration data, wherein the first and the second voltages are generated using charge from the input voltage; and
an oscillator that varies a frequency of a periodic output signal within a frequency range in response to changes in a control voltage, wherein the regulated supply voltage drives the oscillator, and the frequency range of the periodic output signal of the oscillator varies when the first control signal causes the regulated supply voltage to change from the first voltage to the second voltage.

2. The circuit defined in claim 1 wherein the programmable regulator comprises:
a programmable current source; and
an operational amplifier having an input that is coupled to the programmable current source.

3. The circuit defined in claim 2 wherein the programmable regulator further comprises:
a first transistor coupled to receive the input voltage; and
a second transistor coupled to receive current from the first transistor, wherein current through the second transistor is controlled by the operational amplifier, and the operational amplifier controls the regulated supply voltage at a terminal of the second transistor based on a reference voltage generated by the programmable current source.

4. The circuit defined in claim 3 wherein the programmable regulator further comprises a filter that comprises:
a resistor coupled between a control input of the first transistor and the input voltage;
a capacitor coupled to the resistor; and
a constant current source coupled to the control input of the first transistor.

5. The circuit defined in claim 1 wherein the programmable regulator comprises a programmable current source, and the programmable current source comprises:
a current mirror circuit comprising first, second, and third transistors, wherein a control input of the first transistor is coupled to a control input of the second transistor; and
a switch coupled to the control input of the first transistor and a control input of the third transistor, wherein a conductive state of the switch is controlled by the first control signal.

6. The circuit defined in claim 1 wherein the programmable regulator varies the regulated supply voltage between at least three discrete voltages in response to the first control signal and a second control signal, and wherein the oscillator varies the frequency range of the periodic output signal when the regulated supply voltage changes between the three discrete voltages.

7. The circuit defined in claim 6 wherein the programmable regulator varies the regulated supply voltage between at least five discrete voltages in response to the first control signal, the second control signal, and a third control signal, wherein the first, the second, and the third control signals are digital control signals.

8. The circuit defined in claim 7 wherein the circuit is a programmable logic integrated circuit, and the first, the second, and the third digital control signals are generated in response to user configuration data stored in memory on the programmable logic integrated circuit.

9. The circuit defined in claim 1 wherein the oscillator comprises:
first and second varactors; and
an inductor coupled to the first and the second varactors, wherein capacitances of the first and the second varactors vary in response to variations in the regulated supply voltage that are caused by the first control signal.

10. The circuit defined in claim 1 wherein the oscillator is a voltage-controlled oscillator that generates periodic output clock signals.

11. The circuit defined in claim 1 further comprising:
a phase-frequency detector;
a charge pump coupled to the phase-frequency detector; and
a loop filter coupled to the charge pump and the oscillator, wherein the phase-frequency detector, the charge pump, the loop filter, and the oscillator are part of a phase-locked loop circuit.

12. A circuit comprising:
an oscillator that generates a periodic output signal, wherein a frequency of the periodic output signal varies between a maximum frequency and a minimum frequency in response to variations in a control voltage; and
a programmable regulator that provides a regulated supply voltage to the oscillator using an input voltage and that varies the regulated supply voltage between first and second voltages in response to a first control signal, wherein the programmable regulator comprises a programmable current source that varies an output current in response to the first control signal, both of the first and the second voltages are generated with current from the input voltage, and the maximum and the minimum frequencies of the periodic output signal of the oscillator change in response to the first control signal causing the regulated supply voltage to change from the first voltage to the second voltage.

13. The circuit defined in claim 12 wherein the oscillator and the programmable regulator are part of a phase-locked loop, and the control voltage is generated by a charge pump.

14. The circuit defined in claim 12 wherein
the programmable current source varies the output current in response to the first control signal and a second control signal, and wherein the programmable regulator varies the regulated supply voltage between the first, the second, and third voltages in response to variations in the output current of the programmable current source that are caused by changes in the first and the second control signals.

15. The circuit defined in claim 14 wherein the programmable regulator further comprises:
an amplifier having an input coupled to the programmable current source; and
first and second transistors coupled in series between the input voltage and the oscillator, wherein the amplifier controls a current through the second transistor to affect the regulated supply voltage.

16. The circuit defined in claim 12 wherein the programmable regulator varies the regulated supply voltage between at least three discrete voltages in response to the first control signal and a second control signal, the maximum and the minimum frequencies of the periodic output signal change in response to the first and the second control signals causing the regulated supply voltage to change between the three discrete voltages, and the three discrete voltages are generated with current from the input voltage.

17. The circuit defined in claim 16 wherein the circuit is a programmable logic integrated circuit, and the first and the second control signals are generated in response to user configuration data stored in memory on the programmable logic integrated circuit.

18. A method for shifting a center frequency of an oscillator circuit, the method comprising:

generating a regulated supply voltage based on an input voltage using a programmable regulator circuit;

varying the regulated supply voltage between first and second voltages by varying a first current generated by a programmable current source in response to a first control signal, wherein the first and the second voltages are generated using charge from the input voltage;

driving the oscillator circuit using the regulated supply voltage;

varying a frequency of an output clock signal of the oscillator circuit in response to a control voltage; and varying a center frequency of the output clock signal of the oscillator circuit when the programmable regulator circuit varies the regulated supply voltage between the first and the second voltages in response to the first control signal.

19. The method defined in claim 18 wherein varying the regulated supply voltage between the first and the second voltages further comprises adjusting a second current through a transistor using an amplifier in response to varying the first current generated by the programmable current source.

20. The method defined in claim 18 wherein varying the regulated supply voltage between the first and the second voltages further comprises varying the regulated supply voltage between at least three voltages in response to the first control signal and a second control signal, and wherein varying the center frequency of the output clock signal of the oscillator circuit when the programmable regulator circuit varies the regulated supply voltage between the first and the second voltages in response to the first control signal further comprises varying the center frequency of the output clock signal when the programmable regulator circuit varies the regulated supply voltage between the second voltage and a third voltage, wherein the third voltage is generated using charge from the input voltage.

21. A circuit comprising:

a programmable current source;

an operational amplifier that generates a regulated supply voltage using an input voltage controlled by the programmable current source and that changes the regulated supply voltage from a first voltage to a second voltage in response to a first control signal; and an oscillator that varies a frequency of a periodic output signal within a frequency range in response to changes in a control voltage, wherein the regulated supply voltage drives the oscillator, and the frequency range of the periodic output signal of the oscillator varies when the first control signal causes the regulated supply voltage to change from the first voltage to the second voltage.

* * * * *